(12) United States Patent
Coppens et al.

(10) Patent No.: US 6,261,733 B1
(45) Date of Patent: Jul. 17, 2001

(54) SILVER SALT DIFFUSION TRANSFER MATERIAL SENSITIZED FOR BLUE LIGHT

(75) Inventors: Paul Coppens, Turnhout; Ludo Vervloet, Kessel; Paul Callant, Edegem, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/562,945

(22) Filed: May 3, 2000

Related U.S. Application Data

(60) Provisional application No. 60/137,170, filed on Jun. 1, 1999.

(30) Foreign Application Priority Data

May 10, 1999 (EP) .................................................. 99201522

(51) Int. Cl.$^7$ .............................. G03C 8/06; G03C 8/52; G03C 8/44; G03F 7/07
(52) U.S. Cl. .......................... 430/230; 430/204; 430/227; 430/517; 430/519; 430/606
(58) Field of Search ................................... 430/204, 230, 430/519, 606, 517

(56) References Cited

U.S. PATENT DOCUMENTS 4,686,170 * 8/1987 Vermeulen et al. ................. 430/204
4,988,611 * 1/1991 Anderson et al. ................... 430/606

FOREIGN PATENT DOCUMENTS 0 554 585  8/1993 (EP) .
0 751 432  1/1997 (EP) .

* cited by examiner

Primary Examiner—Richard L. Schilling
(74) Attorney, Agent, or Firm—Breiner & Breiner

(57) ABSTRACT

According to the present invention, there is provided a silver salt diffusion transfer material, comprising on a hydrophilic surface of a support in the order given (i) an image receiving layer containing physical development nuclei, (ii) a photosensitive layer containing a silver halide emulsion being in water permeable relationship with said image receiving layer and (iii) a top layer containing gelatin, said silver halide emulsion being spectrally sensitized with a dye with a sensitizing maximum between 380 and 430 nm, characterized in that said top layer comprises a compound I Compound I

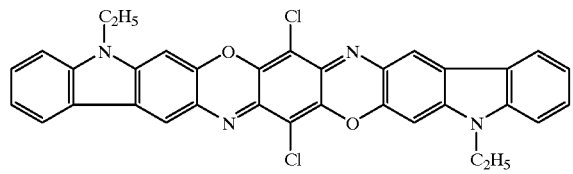

and/or a compound II Compound II

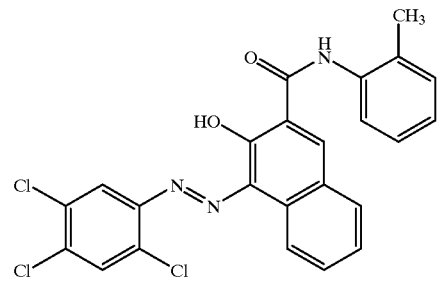

10 Claims, No Drawings

SILVER SALT DIFFUSION TRANSFER MATERIAL SENSITIZED FOR BLUE LIGHT

Priority is claimed under 35 CSC 119 (E) based on provisional application Ser. No. 60/137,170 filed Jun. 1, 1999.

FIELD OF THE INVENTION

The present invention relates to a silver salt diffusion transfer material suitable for making a printing plate.

More specifically, the present invention relates to a silver salt diffusion transfer material for making a printing plate that is spectrally sensitized for light of about 400 nm.

BACKGROUND OF THE INVENTION

With recent rapid progress of information transmitting systems, silver halide photographic light sensitive materials have been increasingly required to have high sensitivity. Such systems are, for example, high speed phototypesetting systems according to which information output from an electronic computer is immediately displayed as letters or figures by a cathode ray tube and press facsimile systems for rapid transmission of news paper originals to remote places.

Photographic phototype setting materials include photographic films and papers used in a process for preparing a lithographic printing plate and silver salt diffusion transfer, called DTR-based lithographic printing plates disclosed in e.g. U.S. Pat. No. 4,501,811 and U.S. Pat. No. 4,784,933. With the latter materials a lithographic printing plate is immediately obtained without the need of a contact exposure or camera exposure.

Todate on the market phototypesetters usually work with a He/Ne laser (632 nm), a laser diode (680 nm) or LED (670 or 780 nm). Especially phototypesetters that operate with a He/Ne laser or LED (670–680 nm) are frequently employed. Since these light sources emit in a very narrow spectral range photographic materials were developed for each of the above mentioned light sources.

A disadvantage of all these materials is that they are sensitive to visible light and have to be treated in a dark room. Recently, there are available lasers which emit in the spectral range of 390–410 nm. Materials, sensitive for said lasers could have the possibility of being treated in subdued yellow light.

However, when said deep blue lasers are used to irradiate an imaging element comprising in the order given on a hydrophilic surface of a support (i) an image receiving layer containing physical development nuclei, (ii) a photosensitive layer containing at least one silver halide emulsion in water permeable relationship with said image receiving layer and spectrally sensitized for said laser, the imaging element can still not be treated under subdued yellow light without an unwanted increase in sensitivity, leading to an irreproducible sensitivity and possibly fog.

OBJECTS OF THE INVENTION

It is an object of the present invention to provide a high speed photographic material that can be imaged using scanning exposure beams with wavelengths in the deep blue i.e. between 390 and 410 nm and that yields printing plates of high contrast and high resolving power.

It is a further object of the present invention to provide a high speed photographic material that can be imaged using scanning exposure beams with wavelengths in the deep blue and that can be treated under subdued yellow light.

It is still a further object of the invention to provide a method for obtaining a lithographic plate with said photographic material.

Further objects of the present invention will become clear from the description hereafter.

SUMMARY OF THE INVENTION

According to the present invention, there is provided a silver salt diffusion transfer material, comprising on a hydrophilic surface of a support in the order given (i) an image receiving layer containing physical development nuclei, (ii) a photosensitive layer containing a silver halide emulsion being in water permeable relationship with said image receiving layer and (iii) a top layer containing gelatin, said silver halide emulsion being spectrally sensitized with a dye with a sensitizing maximum between 380 and 430 nm, characterized in that said top layer comprises a compound I

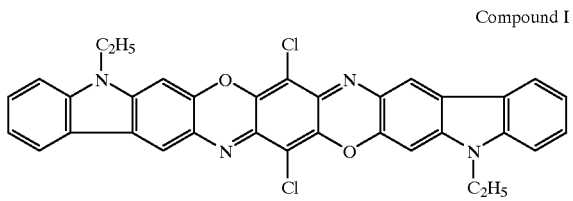

Compound I and/or a compound II

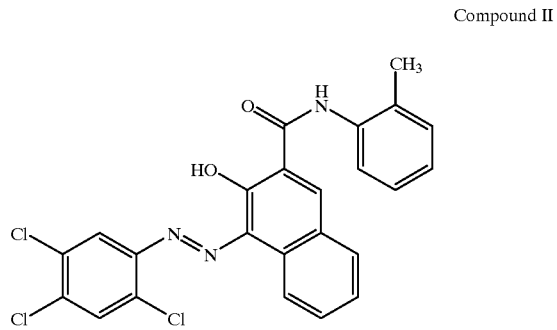

Compound II

DETAILED DESCRIPTION OF THE INVENTION

Compound I and compound II can be used together but are preferably used separately. The amount of compound I and/or compound II in the top layer ranges preferably from 50 mg/m² to 1000 mg/m², more preferably from 100 mg/m² to 500 mg/m².

Said silver halide photographic emulsion is spectrally sensitized with spectral sensitizing dyes having preferably their sensitizing maximum in the range between 390 nm and 415 nm. More preferred said spectral sensitizing dyes are compounds corresponding

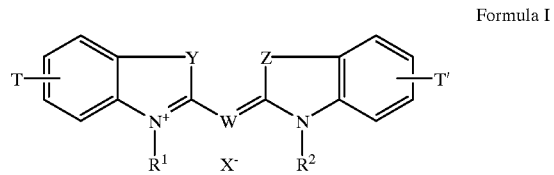

Formula I

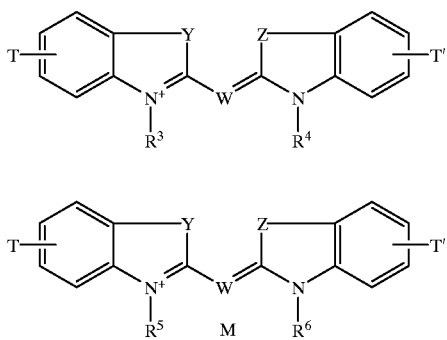

Formula II

Formula III to the general formulas I, II or III wherein each of Y and Z independently represents O or S, W represents CH or N, T and T' each represents hydrogen, or one or more substituents selected from the group consisting of alkyl, aryl, aralkyl, alkoxy, halogen, cyano, fused-on ring, $R^1$ and $R^2$ each independently represents an alkyl group, preferably methyl or ethyl, $R^3$ and $R^4$ each independently represents an alkyl group wherein one of said groups carries an anionic group, $R^5$ and $R^6$ each independently represents alkyl groups carrying an acidic group, one of these acid groups being in anionic form, preferably butylsulphonic acid, $X^-$ represents an anion, e.g. $F^-$, $Cl^-$, $Br^-$, $I^-$, toluene sulphonate, triflate, $ClO_4^-$ etc. . . and M represents a basic group, preferably an ammine group. Most preferred sensitizing dyes are compounds corresponding to formula I. Examples of deep blue sensitizing dyes according to formula I and III are shown in respectively tables 1 and 2.

TABLE 1

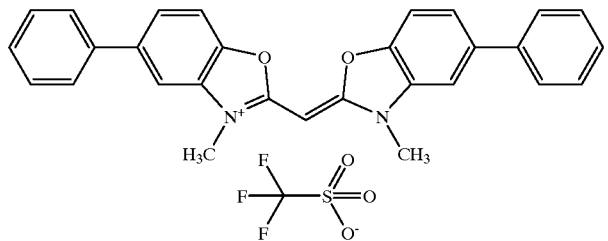

Dye I-1

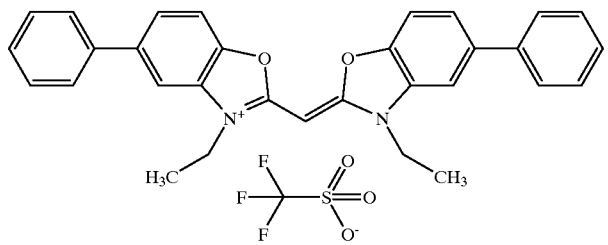

Dye I-2

TABLE 2

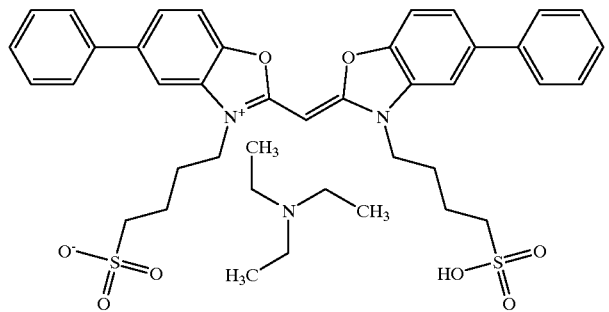

Dye III-1

TABLE 2-continued

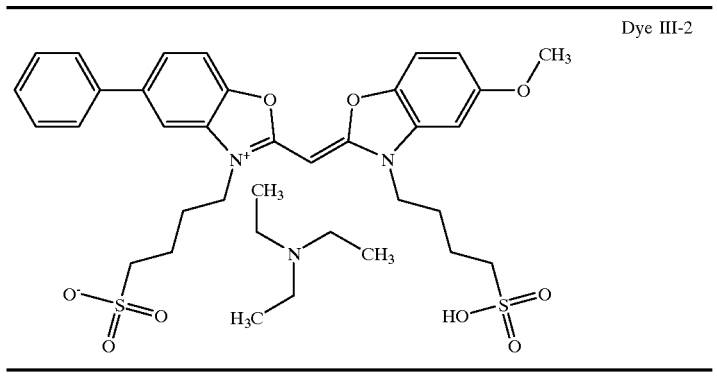

Dye III-2

The spectral sensitizing dye is preferably present in said photographic emulsion in an amount between 0.3 and 3 mmole/mole AgX, more preferably in an amount between 0.5 and 1.5 mmole/mole AgX.

The silver halide emulsion or emulsions according to the invention are substantially free from silver bromide. Substantially free from silver bromide means that said silver halide emulsion or emulsions comprises less than 1 mole % of silver bromide, preferably less than 0.1 mole % of silver bromide, still more preferably less than 0.01 mole % most preferably is totally free from silver bromide.

The silver halide emulsion or emulsions according to the invention preferably comprises a minor amount of silver iodide. A minor amount means between 1 mole % and 0.01 mole %, more preferably between 0.03 and 0.1 mole %. Said iodide is preferably present in the outer sphere of said silver halogenide.

The photosensitive layer used according to the present invention may be any layer comprising a hydrophilic colloid binder and at least one silver halide emulsion, at least one of the silver halide emulsions being photosensitive and all of the silver halide emulsions being substantially free from silver bromide.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

Preferably a silver halide emulsion containing at least 99 mole % of silver chloride is used in order to be suitable for treatment in subdued yellow light.

The average size of the silver halide grains may range from 0.10 to 0.70 μm, preferably from 0.25 to 0.45 μm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P-493 464 and 568 687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers. Preferably the silver halide emulsion layer contains at least one gelatin species whereof a 10% by weight aqueous solution at 36° C. and pH 6 has a viscosity lower than 20 mPas at a shearing rate of 1000 $s^{-1}$ combined with a gelatin of a higher viscosity. The weight ratio of said low viscosity gelatin versus the gelatin of a higher viscosity is preferably>0.5.

Preferably the gelatin layer(s) is (are) substantially unhardened. Substantially unhardened means that when such gelatin layer is coated on a subbed polyethylene terephtalate film base at a dry thickness of 1.2 g/m², dried for 3 days at 57° C. and 35% R. H. and dipped in water of 30° C., said gelatin layer is dissolved for more than 95% by weight within 5 minutes.

Said binder preferably comprises polyvinylpyrrolidone in an amount between 0.0125 g and 1.25 g/m², more preferably in an amount between 0.0625 g and 0.25 g/m². Said polyvinylpyrrolidone is preferably added together with or after the spectral sensitizing dye. The addition of said polyvinylpyrrolidine improves the ink acceptance of the resulting printing plate. Said effect is not limited to the imaging elements according to the invention, but is also observed with imaging elements according to the invention which are however sensitized for other wavelengths.

The silver halide emulsions may contain pH controlling ingredients. Preferably at least one gelatin containing layer is coated at a pH value not below the iso-electric point of the gelatin to avoid interactions between said gelatin containing coated layer and the hereafter mentioned intermediate layer. More preferably the gelatin layer contiguous to said intermediate layer is coated at a pH value not below the isoelectric point of the gelatin. Most preferably all the gelatin containing layers are coated at a pH value not below the iso-electric point of their gelatin. Other ingredients such as antifogging agents, development accelerators, wetting agents, and hardening agents for gelatin may be present. The silver halide emulsion layer may comprise light-screening dyes that absorb scattering light and thus promote the image sharpness.

More details about the composition, preparation and coating of silver halide emulsions suitable for use in accordance with the present invention can be found in e.g. Product Licensing Index, Vol. 92, Dec. 1971, publication 9232, p. 107–109.

The photographic material according to the invention contains a top layer, also called an anti-stress composition.

The antistress composition preferably comprises unhardened gelatin in an amount ranging from 0.60 to 1.75 $g/m^2$, more preferably in an amount ranging from 0.80 to 1.25 $g/m^2$.

Preferably at least 50%, more preferably at least 75%, most preferably at least 90% by weight of said unhardened gelatin belongs to one or more gelatin species whereof a 10% by weight aqueous solution at 40° C. and pH 6 has a viscosity lower than 20 mPas, more preferably lower than 15 mPas at a shearing rate of 1000 $s^{-1}$.

The antistress composition can comprises more than one species of unhardened gelatin whereof a 10% by weight aqueous solution at 40° C. and pH 6 has a viscosity lower than 20 mPas at a shearing rate of 1000 $s^{-1}$, but it is preferred for practical reasons that said composition comprises only one such gelatin. When a mixture of unhardened gelatins is used, a 10% by weight aqueous solution of said mixture of unhardened gelatins has at 40° C. and pH 6 preferably a viscosity lower than 20 mPas at a shearing rate of 1000 $s^{-1}$.

The antistress composition may contain small particles e.g. matting agents with a mean diameter between 0.2 and 10 mm in order to improve the diffusion of processing solutions through said antistress composition.

The antistress composition can comprise more than one layer, but for practical reasons it is preferred that said composition consist of one layer.

The antistress layer according to the invention has to be in water permeable relationship with said image receiving layer in the imaging element. Layers being in waterpermeable contact with each other are layers that are contiguous to each other or only separated from each other by (a) water-permeable layer(s). The nature of a waterpermeable layer is such that it does not substantially inhibit or restrain the diffusion of water or of compounds contained in an aqueous solution e.g. developing agents or the complexed silver.

The imaging element is preferably prepared by coating the different layers on a hydrophilic surface of a support. Alternatively the different layers may be laminated to said image receiving layer from a temporary base holding the layers in reverse order as disclosed in U.S. Pat. No. 5,068,165.

Said hydrophilic surface of a support can be a hardened hydrophilic layer, containing a hydrophilic binder and a hardening agent coated on a flexible support.

Such hydrophilic binders are disclosed in e.g. EP-A-450 199, which therefor is incorporated herein by reference. Preferred hardened hydrophilic layers comprise partially modified dextrans or pullulan hardened with an aldehyde as disclosed in e.g. EP-A-514 990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P-1 419 512, FR-P-2 300 354, U.S. Pat. No. 3,971,660, U.S. Pat. No. 4,284,705, EP-A-405 016 and EP-A-450 199 which therefor are incorporated herein by reference.

Flexible supports may be opaque or transparent, e.g. a paper support or resin support. When a paper support is used preference is given to one coated at one or both sides with an Alpha-olefin polymer. It is also possible to use an organic resin support e.g. poly (ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide.

Said hydrophilic surface of a support is preferably a hydrophilic metallic support e.g. an aluminum foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1,5 $\mu m$, an anodization layer with a thickness between 0.4 and 2.0 $\mu m$ and is posttreated with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

After roughening and optional chemical etching the aluminum foil is anodized which may be carried out as follows.

An electric current is passed through the grained aluminum foil immersed as an anode in a solution containing an acid. An electrolyte concentration from 1 to 70% by weight can be used within a temperature range from 0–70° C. The anodic current density may vary from 1–50 $A/dm^2$ and a voltage within the range 1–100 V to obtain an anodized film weight of 1–8 g/m² $Al_2O_3.H_2O$. The anodized aluminum foil may subsequently be rinsed with demineralised water within a temperature range of 10–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminium". Different types of sealing of the porous anodized aluminum surface exist.

Preferably, said sealing is performed by treating a grained and anodized aluminum support with an aqueous solution containing a bicarbonate as disclosed in EP-A-567 178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-PU-58 14 797.

Subsequent to the preparation of the hydrophilic layer of a support as described above, said hydrophilic layer may be immediately coated with a solution containing the physical development nuclei or may be coated with said solution at a later stage.

The image receiving layer preferably comprises physical development nuclei in an amount ranging from 0.1 mg to 20 mg/m². The image receiving layer containing physical development nuclei may be free of hydrophilic binder but preferably comprises amounts upto 80% by weight of the total weight of said layer of a hydrophilic colloid e.g. polyvinyl alcohol to improve the hydrophilicity of the surface.

Preferred development nuclei for use in accordance with the present invention are sulphides of heavy metals e.g. the sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

Preferably, the imaging element also comprises an intermediate layer between the image receiving layer on the hydrophilic surface of a support and the photosensitive layer (packet) to facilate the removal of said layer (packet) thereby uncovering the silver image formed in the image receiving layer by processing the imaging element.

In one embodiment, the intermediate layer is a water-swellable intermediate layer coated at a ratio of 0.01 to 2.0 g/m2 and comprising at least one non-proteinic hydrophilic film-forming polymer e.g. polyvinyl alcohol and optionally comprising an antihalation dye or pigment as disclosed in EP-A-410 500.

In another embodiment, the intermediate layer is a layer comprising hydrophobic polymer beads having an average diameter not lower than 0.2 mm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483 415.

Said intermediate layer or a supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigments, developing agents, silver halide solvents, base precursors, and anticorrosion substances. Preferably a yellow antihalation pigment is present, more preferably LEVANYL GELB™ (trade name of a yellow pigment from Bayer, Germany). Said yellow antihalation pigment is preferably present in an amount between 50 and 1000 mg/m², more preferably in an amount between 100 and 500 mg/m².

When the imaging element is prepared by laminating a layer packet comprising a photosensitive layer onto the image receiving layer the intermediate layer (s) are provided on the photosensitive layer (s), the water-swellable intermediate layer or the intermediate layer comprising hydrophobic polymer beads having an average diameter not lower than 0.2 mm and having been prepared by polymerization of at least one ethylenically unsaturated monomer being the upper layer.

According to the present invention the imaging element can be information-wise exposed to a laser or a laser emitting diode emitting light in the range from 390 to 410 nm.

According to the present invention the development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution in the presence of (a) developing agent(s), and (a) silver halide solvent(s). The developing agent(s) and/or the silver halide solvent(s) can be incorporated in the aqueous alkaline solution and/or in the imaging element.

Preferably a silver halide solvent in the aqueous alkaline solution is used in an amount between 0.05% by weight and 5% by weight and more preferably between 0.5% by weight and 2% by weight.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Examples of alkanolamines that may be used in connection with the present invention correspond to the following formula:

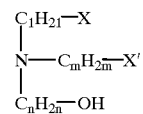

wherein X and X' independently represent hydrogen, a hydroxyl group or an amino group, 1 and m represent 0 or integers of 1 or more and n represents an integer of 1 or more. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers. Preferably used thioethers correspond to the following general formula:

$$Z-(R_1-S)_t-R_2-S-R_3-Y$$

wherein Z and Y each independently represents hydrogen, an alkyl group, an amino group, an ammonium group, a hydroxyl, a sulfo group, a carboxyl, an aminocarbonyl or an aminosulfonyl, $R_1$, $R_2$ and $R_3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A-554 585.

Still further suitable silver halide solvents are 1,2,4-triazolium-3-thiolates, preferably 1,2,4-triazolium-3-thiolates substituted with at least one substituent selected from the group consisting of a $C_1$–$C_8$ alkyl group that contains at least 3 fluorine atoms, a $C_4$–$C_{10}$ hydrocarbon group and a 4-amino group substituted with a $C_{1-C8}$ alkyl group that contains at least 3 fluorine atoms and/or a $C_4$–$C_{10}$ hydrocarbon group.

Combinations of different silver halide solvents can be used and it is also possible to incorporate at least one silver halide solvent into a suitable layer of the imaging element and to add at least one other silver halide solvent to the developing solution.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc.. Examples of 1-phenyl-3-pyrazolidones subsituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc.. However other developing agents can be used.

Preferred amounts of the hydroquinone-type developing agents are in the range of 0.05 mole to 0.40 mole per litre and preferred amounts of secondary developing agent(s) in the range of $1.8 \times 10^{-3}$ to $2.0 \times 10^{-1}$ mole per liter.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The quantitative ranges given for the developing agents, silver halide solvents, and sulphite apply to the amount of these compounds present as solutes in the aqueous alkaline solution during the DTR-processing, whether these compounds make part of the aqueous alkaline solution or were dissolved from the layers containing them upon application thereto of the aqueous alkaline solution.

The aqueous alkaline solution suitable for use according to the present invention preferably comprises aluminum ions in an amount of at least 0.3 g/l, more preferably in an amount of at least 0.6 g/l in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc.. Suitable organic alkaline substances are e.g. alkanolamines. In the latter case the alkanolamines will provide or help providing the pH and serve as a silver halide complexing agent.

The aqueous alkaline solution may further comprise hydrophobizing agents for improving the hydrophobicity of the silver image obtained in the image receiving layer. Generally these compounds contain a mercapto group or thiolate group and one or more hydrophobic substituents. Particularly preferred hydrophobizing agents are mercapto-1,3,4-thiadiazoles as described in DE-A-1 228 927 and in U.S. Pat. No. 4,563,410, 2-mercapto-5-alkyl- oxa-3,4-diazole, 3-mercapto-5-alkyl-1,2,4-triazoles and long chain (at least 5 carbon atoms) alkyl substituted mercaptotetrazoles. The hydrophobizing agents can be used alone or in combination with each other.

These hydrophobizing compounds can be added to the aqueous alkaline solution in an amount of preferably 0.1 to 3 g per liter and preferably in admixture with 1-phenyl-5-mercaptotetrazole, the latter compound may be used in amounts of e.g. 50 mg to 1.2 g per liter of solution, which may contain a minor amount of ethanol to improve the dissolution of said compounds.

The aqueous alkaline solution may comprise other ingredients such as e.g. oxidation preservatives, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range from 5 to 7.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C. and in a time from 5 s to 5 min.

After formation of the silver image on the hydrophilic surface of a support an excess of aqueous alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the hydrophilic support.

According to a particularly preferred embodiment of the present invention the silver image in the layer of physical development nuclei is uncovered by washing off all the layers above the layer containing physical development nuclei with rinsing water.

The temperature of the rinsing water may be varied widely but is preferably between 30° C. and 50° C., more preferably between 35° C. and 45° C.

The imaged surface of the hydrophilic surface of a support can be subjected to a chemical treatment that increases the hydrophilicity of the non-silver image parts and the oleophilicity of the silver image.

This chemical after-treatment is preferably carried out with a lithographic composition often called finisher comprising at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Preferred compounds correspond to one of the following formulas:

Formula 1

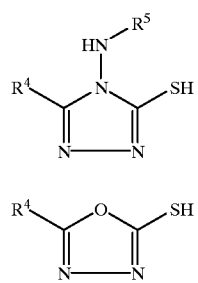

Formula 2 wherein R5 represents hydrogen or an acyl group, R4 represents alkyl, aryl or aralkyl. Most preferably used compounds are compounds according to one of the above formulas wherein R4 represents an alkyl containing 3 to 16 C-atoms. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acidic polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyglycols being the reaction products of ethyleneoxide and/or propyleneoxide with water or an alcohol and polyvinyl alcohol. Optionally, hygroscopic substances e.g. sorbitol, glycerol, tri (hydroxyethyl) ester of glycerol, and turkish red oil may be added.

Furthermore (a) surface-active compound(s) is (are) preferably also added to the finisher. The concentration thereof may vary within broad ranges provided the finisher shows no excessive degree of foaming when plates are finished. Preferred surface-active compound are anionic or non-ionic surface-active compound.

A suitable finisher as disclosed in U.S. Pat. No. 4,563,410 is a composition comprising a solution of a mercaptotriazole in a solution of polyethylene oxide with a molecular weight of 4,000. Further suitable finishers have been described in i.a. U.S. Pat. No. 4,062,682.

At the moment the treatment with the finisher is started the surface carrying the silver pattern may be in dry or wet state. In general, the treatment with the finisher does not take long, usually not longer than about 30 seconds and it may be carried out immediately after the processing and uncovering steps, preferably at a temperature of the finisher in the range from 30° C. to 60° C.

The finisher can be applied in different ways such as by rubbing with a roller, by wiping with an absorbent means e.g. with a plug of cotton or sponge, or by dipping the material to be treated in the finisher. The image-hydrophobizing step of the printing plate may also proceed automatically by conducting the printing plate through a device having a narrow channel filled with the finisher and conveying the printing plate at the end of the channel between two squeezing rollers removing the excess of liquid.

As soon as the hydrophilic surface of a support carrying the silver image has been treated with the finisher, it is ready to be used as a printing plate.

The following examples illustrate the present invention without however, limiting it thereto. All parts, percentages and ratios are by weight unless otherwise indicated.

EXAMPLE 1

A 0,30 mm thick aluminium foil (AA 1050) was degreased by immersing the foil in an aqueous solution containing 25 g/l sodium hydroxide at a temperature of 65° C. The foil was then electrochemically grained using an alternating current in an aqueous solution containing 12 g/l of hydrochloric acid, 7 g of sulphate ion and 7 g/l of aluminum ion at a temperature of 35° C. to form a surface topography with a mean roughness depth of 0.4 $\mu$m. The aluminium plate was then desmutted with an aqueous solution containing 0.85% of sodium hydroxide at 37° C. for 120 seconds. The foil was subsequently subjected to anodic oxidation in a 15% sulfuric acid aqueous solution containing 1% aluminum ions at 55° C. to form an anodic oxidation film on the front side of 3.0 g/m$^2$ of $Al_2O_3.H_2O$, treated with an aqueous solution containing 10 g/l of $NaHCO_3$ at 45° C. for 30 sec and then rinsed with demineralised water and dried.

Each of the above described steps is separated by a rinsing step to avoid contamination of the liquid used in a particular step with that of the preceding step.

The imaging element I was obtained by coating the grained, anodized and posttreated aluminum support with a silver-receptive stratum containing 2 mg/m$^2$ Ag° as physical development nuclei.

An intermediate layer was then provided on the dry silver-receptive stratum from an aqueous composition of pullulan and LEVANYL GELB™ (trade name of Bayer A.G. for a yellow pigment) in such a way that the resulting dried layer had a weight of 120 mg of pullulan and 250 mg of Levanyl GELB per m$^2$.

At the same time a substantially unhardened photosensitive negative-working cadmium-free deep blue sensitized gelatin silver chloroiodide emulsion layer (99.8/0.2 mol %) containing 1 mole/mole AgX of 4-hydroxy-6-methyl-1,3,3a, 7-tetraazaindene and 2.2 mmole/mole AgX of 1-(3-(2-sulphobenzamido))phenyl-5-mercapto-tetrazole was coated on the intermediate layer, the silver halide being provided in an amount corresponding to 2.50 g of silver nitrate per m$^2$ and the gelatin content of the emulsion layer being 1.50 g/m$^2$, consisting of 0.7 g/m$^2$ of a gelatin with a viscosity of 21 mPas and the remainder of a gelatin with a viscosity of 14 mPa.s. The sensitizing dye was Dye III-2 and was used in an amount of 608.4 mg/mole AgX.

Finally the photosensitive emulsion layer was overcoated with an antistress layer containing no hardeners comprising 0.7 g/m$^2$ gelatin with a viscosity of 10–12 mPa.s (gelatin K 7598 of Koepff), 140 mg/m$^2$ of a copolymer of styrene, methyl methacrylate and maleic acid as matting agent with a weight average diameter of 3.5 μm.

Imaging elements II, III and IV were obtained in an identical way as imaging element I with the exception that the antistress layer contained respectively 100 mg, 250 mg and 500 mg/m$^2$ of compound I.

Imaging elements V, VI, VII and VIII were obtained in an identical way as imaging elements I, II, III and IV with the exception that no LEVANYL GELB was used in the intermediate layer.

From each of the imaging elements one sample was kept in the dark while a second sample was pre-exposed to yellow light at 200 lux for 15 minutes. The yellow light is obtained by using a tubular lamp, wrapped with a filter L489, a neutral density filter 0.30 and a mat film. Afterwards the samples are exposed to a Xenon flash during 10$^{-6}$ sec through a wedge of 0.15 constant. In the next step each sample was immersed for 10 s at 24° C. in a freshly made developing solution having the following composition:

| | |
|---|---|
| carboxymethlcellulose | 4 g |
| sodium hydroxide | 25.5 g |
| anhydrous sodium sulphite | 120 g |
| hydroquinone | 25 g |
| 1-phenyl-4-methyl-3-pyrazolidinone | 3 g |
| potassium bromide | 0.2 g |
| anhydrous sodium thiosulphate | 6 g |
| alum | 11, 4 g |
| demineralized water to make | 1000 ml |
| pH (24° C.) = 13 | |

The initiated diffusion transfer was allowed to continue for 20 s to form a silver image in the image receiving layer.

To remove the developed silver halide emulsion layer, the intermediate layer and the anti-stress layer from the aluminium foil the developed monosheet DTR materials were rinsed for 5 s with a water jet at 40° C. in a LP 82 (tradename of a processor marketed by Agfa-Gevaert, Belgium).

The sensitivity of the samples was then measured and the difference in sensitivity dertermined. The results are given in table 3 where the sensitivities are expressed as 0.01 log It (a higher number means a more sensitive material).

TABLE 3

| Imaging Element | Dark | Pre-exposed | Difference |
|---|---|---|---|
| I | 47 | 99 | 52 |
| II | 35 | 37 | 2 |
| III | 20 | 19 | 1 |
| IV | 20 | 18 | 2 |

TABLE 3-continued

| Imaging Element | Dark | Pre-exposed | Difference |
|---|---|---|---|
| V | 83 | 158 | 75 |
| VI | 64 | 68 | 4 |
| VII | 50 | 50 | 0 |
| VIII | — | — | — |

It is clear from these results that imaging elements with a photosensitive silver halide emulsion, even when sensitized for the deep blue, shows a marked increase in sensitivity when treated in subdued yellow light. When however compound I is added in the top layer, these imaging elements does not change their photographic behavior by treatment under subdued yellow light.

EXAMPLE 2

Imaging element IX–XVI were obtained in an identical way as imaging elements I–VIII with the exception that the the compound I was replaced by compound II. The imaging elements were treated as described in example 1. The results are given in table 4.

TABLE 4

| Imaging Element | Dark | Pre-exposed | Difference |
|---|---|---|---|
| IX | 55 | 70 | 15 |
| X | 35 | 36 | 1 |
| XI | 22 | 22 | 0 |
| XII | — | — | — |
| XIII | 72 | 125 | 53 |
| XIV | 53 | 64 | 11 |
| XV | 32 | 34 | 2 |
| XVI | — | — | — |

Here too, it is clear from these results that imaging elements with a photosensitive silver halide emulsion, even when sensitized for the deep blue, shows a marked increase in sensitivity when treated in subdued yellow light. When however compound II is added in the top layer, these imaging elements does not change their photographic behavior by treatment under subdued yellow light, surely not when the intermediate layer comprises a yellow pigment.

What is claimed is:
1. a silver salt diffusion transfer material, comprising on a hydrophilic surface of a support in the order given (i) an image receiving layer containing physical development nuclei, (ii) a photosensitive layer containing a silver halide emulsion being in water permeable relationship with said image receiving layer and (iii) a top layer containing gelatin, said silver halide emulsion being spectrally sensitized with a dye with a sensitizing maximum between 380 and 430 nm, wherein said top layer comprises a compound I

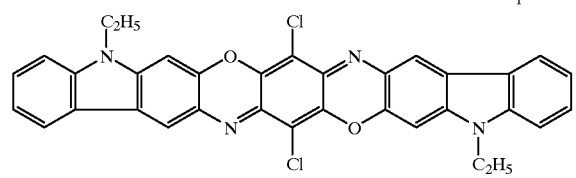
Compound I and/or a compound II

Compound II

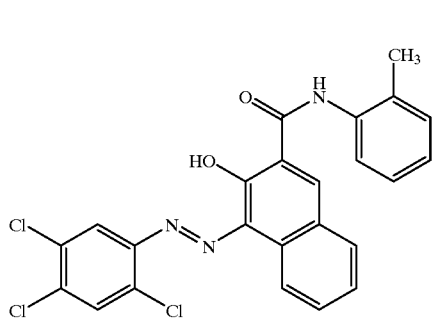

Formula II

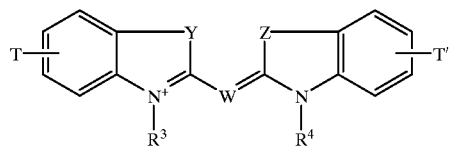

Formula III

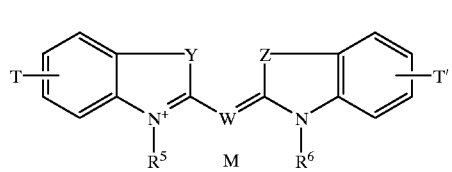

2. An imaging element according to claim 1 wherein said compound is compound I.

3. An imaging element according to claim 1 wherein the amount of compound I and/or II in the top layer ranges from 50 mg/m$^2$ to 1000 mg/m$^2$.

4. An imaging element according to claim 3 wherein the amount of compound I and/or II in the top layer ranges from 100 mg/m$^2$ to 500 mg/m$^2$.

5. An imaging element according to claim 1 wherein said dye with a sensitizing maximum between 380 and 430 has its sensitizing maximum in the range between 390 nm and 415 nm.

6. An imaging element according to claim 5 wherein said dye is a compound corresponding Formula I

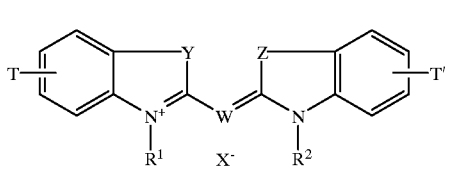

to the general formulas I, II or III wherein each of Y and Z independently represents O or S, W represents CH or N, T and T' each represents hydrogen, or one or more substituents selected from the group consisting of alkyl, aryl, aralkyl, alkoxy, halogen, cyano, fused-on ring, $R^1$ and $R^2$ each independently represents an alkyl group, $R^3$ and $R^4$ each independently represents an alkyl group wherein one of said groups carries an anionic group, $R^5$ and $R^6$ each independently represents alkyl groups carrying an acidic group, one of these acid groups being in anionic form, $X^{31}$ represents an anion, and M represents a cation.

7. An imaging element according to claim 1 wherein said dye is a compound corresponding to formula I.

8. An imaging element according to claim 1 wherein said emulsion layer comprises polyvinylpyrrolidone.

9. An imaging element according to claim 1 wherein said imaging element comprises an intermediate layer between the image receiving layer containing physical development nuclei and the photosensitive layer containing a silver halide emulsion.

10. An imaging element according to claim 9 wherein said intermediate layer comprises a yellow antihalation pigment.

* * * * *

UNITED STATES PATENT AND TRADEMARK OFFICE
CERTIFICATE OF CORRECTION

PATENT NO. : 6,261,733 B1  Page 1 of 1
DATED : July 17, 2001
INVENTOR(S) : Paul Coppens et al.

It is certified that error appears in the above-identified patent and that said Letters Patent is hereby corrected as shown below:

<u>Column 18, claim 6,</u>
Line 27, "$X^{31}$" should read -- $X^-$ --.

Signed and Sealed this

Fifth Day of March, 2002

JAMES E. ROGAN
*Director of the United States Patent and Trademark Office*

*Attest:*

*Attesting Officer*